(12) United States Patent
Chien et al.

(10) Patent No.: US 9,324,428 B1
(45) Date of Patent: Apr. 26, 2016

(54) MEMORY DEVICE AND OPERATION METHOD THEREOF

(71) Applicants: MACRONIX INTERNATIONAL CO., LTD., Hsinchu (TW); INTERNATIONAL BUSINESS MACHINES CORPORATION, Armonk, NY (US)

(72) Inventors: Wei-Chih Chien, New Taipei (TW); Yung-Han Ho, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/727,953

(22) Filed: Jun. 2, 2015

Related U.S. Application Data

(60) Provisional application No. 62/107,489, filed on Jan. 25, 2015.

(51) Int. Cl.
*G11C 11/00* (2006.01)
*G11C 13/00* (2006.01)

(52) U.S. Cl.
CPC ........ *G11C 13/0097* (2013.01); *G11C 13/0004* (2013.01); *G11C 13/0064* (2013.01); *G11C 13/0069* (2013.01)

(58) Field of Classification Search
USPC .......................... 365/148, 158, 163
See application file for complete search history.

(56) References Cited

U.S. PATENT DOCUMENTS

| | | | | |
|---|---|---|---|---|
| 8,031,517 B2 * | 10/2011 | Kim | ................... | G11C 13/0069 365/163 |
| 2010/0195387 A1 * | 8/2010 | Park | ....................... | G11C 16/10 365/185.03 |

\* cited by examiner

*Primary Examiner* — Vu Le
(74) *Attorney, Agent, or Firm* — McClure, Qualey & Rodack, LLP

(57) ABSTRACT

An operation method for a memory device is disclosed. An operation state of the memory device is determined. If to be operated in a first operation state, the memory device is applied by a reset pulse. If to be operated in a second operation state, the memory device is applied by the reset pulse and at least a first incremental pulse set verification current, and an allowable maximum current of the first incremental pulse set verification current is lower than a melt current. If to be operated in a third operation state, the memory device is applied by the reset pulse and at least a first identical pulse set verification current, and an allowable maximum current of the first identical pulse set verification current is lower than the melt current. If to be operated in a fourth operation state, the memory device is applied by a set pulse.

15 Claims, 6 Drawing Sheets

MEMORY DEVICE AND OPERATION METHOD THEREOF

This application claims the benefit of U.S. Provisional application Ser. No. 62/107,489, filed Jan. 25, 2015, the disclosure of which is incorporated by reference herein in its entirety.

TECHNICAL FIELD

The disclosure relates in general to a memory device and an operation method thereof.

BACKGROUND

The storage class memory (SCM) may be used for reducing system latency, and thus draws more intention. However, because of long write latency and high write power consumption, it is difficult to apply the multi-level control (MLC) phase control memory in the SCM.

Thus, there needs a memory device and an operation method thereof, which may improve the performance of the memory device, for example, short write latency and low write power consumption.

SUMMARY

The disclosure is directed to a memory device and an operation method thereof which programs the memory device by at least an incremental pulse set verification current and/or at least an identical pulse set verification current to reduce write latency and write power consumption.

According to one embodiment, an operation method for a memory device is provided. The operation method for a memory device includes: determining an operation state of the memory device; when the memory device is determined to be operated in a first operation state, applying a reset pulse to the memory device; when the memory device is determined to be operated in a second operation state, applying the reset pulse and at least a first incremental pulse set verification current to the memory device, an allowable maximum current of the first incremental pulse set verification current being lower than a melt current; when the memory device is determined to be operated in a third operation state, applying the reset pulse and at least a first identical pulse set verification current to the memory device, an allowable maximum current of the first identical pulse set verification current being lower than the melt current; and when the memory device is determined to be operated in a fourth operation state, applying a set pulse to the memory device.

According to another embodiment, a memory device is provided. The memory device includes: a memory array; a control circuit, determining an operation state of the memory array according to an input data; and a pulse generation circuit, coupled to the memory array and the control circuit, and controlled by the control circuit. When the control circuit determines the memory array to be operated in a first operation state, the pulse generation circuit applies a reset pulse to the memory array. When the control circuit determines the memory array to be operated in a second operation state, the pulse generation circuit applies the reset pulse and at least a first incremental pulse set verification current to the memory array, an allowable maximum current of the first incremental pulse set verification current being lower than a melt current. When the control circuit determines the memory array to be operated in a third operation state, the pulse generation circuit applies the reset pulse and at least a first identical pulse set verification current to the memory array, an allowable maximum current of the first identical pulse set verification current being lower than the melt current. When the control circuit determines the memory array to be operated in a fourth operation state, the pulse generation circuit applies a set pulse to the memory device.

Figure 1:
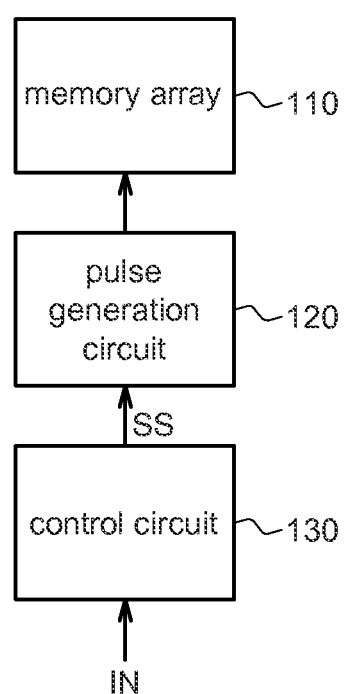
FIG. 1 shows a functional block diagram of a memory device according to an embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory device according to an embodiment of the application. As shown in FIG. 1, the memory device 100 includes: a memory array 110, a pulse generation circuit 120 and a control circuit 130. The memory device 100 is for example but not limited by a 2-terminal memory device. Further, the 2-terminal memory device for example includes a resistive type memory device. The resistive type memory device for example includes a phase change memory (PCM) device, a magnetoresistive random access memory (MRAM) device or a resistive random access memory (RRAM, ReRAM) device.

The memory array 110 includes a plurality of memory cells arranged in an array. The memory cells may be the MLC (multi-level control) phase change memory cells, which store data by different resistance levels. For example, if programmed to high resistance, the memory cells may store bit "1"; and if programmed to low resistance, the memory cells may store bit "0". A single memory cell may store at least 2 bits.

The control circuit 130 determines the operation state of the memory based on the input data IN and generates a state signal SS.

The pulse generation circuit 120 is coupled to the memory array 110 and the control circuit 130. Based on the state signal SS from the control circuit 130, the pulse generation circuit 120 generates pulses to the memory array 110, for programming the memory array 110 to different states. In here, the memory array 110 may have 4 different states 00, 01, 10 and 11. The state 00 refers that the memory cells are programmed for storing bits 00, and so on.

Now explain the programming of the memory array in the embodiment of the application.

Figure 2:
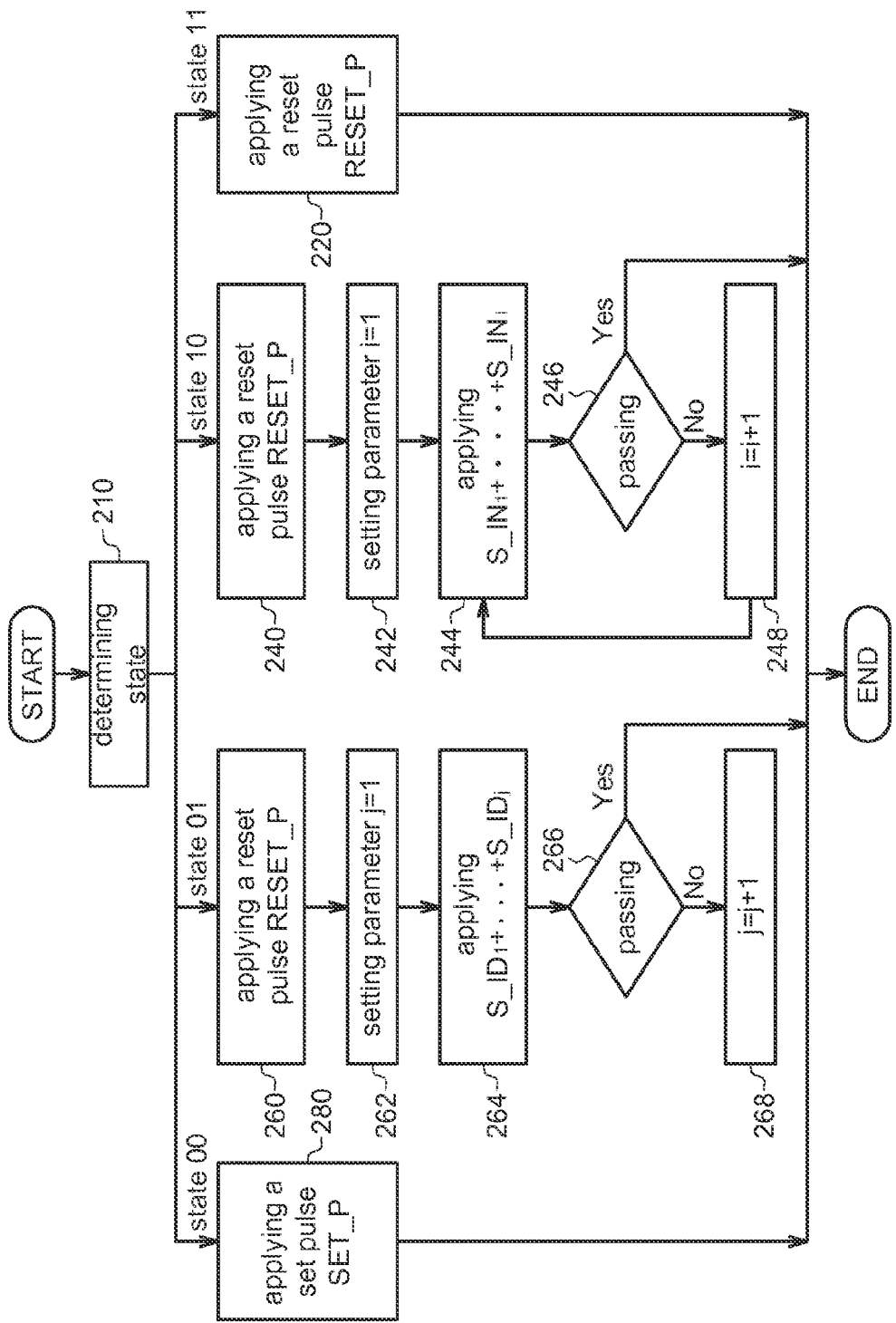
FIG. 2 shows an operation method for a memory device according to an embodiment of the application.

FIG. 2 shows an operation method for a memory device according to an embodiment of the application. As shown in FIG. 2, in step 210, the state of the memory array 110 is determined. For example, the control circuit 130 determines the operation state (one of the states 00, 01, 10 and 11) of the memory array 110 based on the input data IN. If the memory array 110 is to be programmed to the state 11, as shown in step 220, a reset pulse RESET_P is applied to the memory array 110. If the memory array 110 is to be programmed to the state 10, as shown in step 240-248, the reset pulse RESET_P and incremental pulse set verification currents $S\_IN_1 + S\_IN_2 + \ldots$ are applied to the memory array 110. If the memory array 110 is to be programmed to the state 01, as shown in step 260-268, the reset pulse RESET_P and identical pulse set verification currents $S\_ID_1 + S\_ID_2 + \ldots$ are applied to the memory array 110. If the memory array 110 is to be programmed to the state 00, as shown in step 280, a set pulse SET_P is applied to the memory array 110.

Details of programming the memory array 110 to the state 10 are described. As shown in step 240, the reset pulse RESET_P is applied to the memory array 110. As shown in step 242, a parameter "i" is set as an initial value (i=1), and the parameter "i" refers to the count of the incremental pulse set verification currents applied to the memory array. In the step 244, incremental pulse set verification currents $S\_IN_1 + S\_IN_2 + \ldots S\_IN_i$ are applied to the memory array 110. In the step 246, whether the memory array 110 passes the verification is checked (that is, whether the memory array 110 is already programmed to the state 10 is checked). If yes, then the operation is ended. If no, in the step 248, the parameter "i" is added by 1 (i=i+1) and the flow returns to the step 244. That is to say, if the memory array 110 is not programmed to the state 10 yet, then the count of the applied incremental pulse set verification currents is increased (for example, increased by 1).

Details of programming the memory array 110 to the state 01 are described. Similarly, as shown in step 260, the reset pulse RESET_P is applied to the memory array 110. As shown in step 262, a parameter "j" is set as an initial value (j=1), and the parameter "j" refers to the count of the identical pulse set verification currents applied to the memory array. In the step 264, the identical pulse set verification currents $S\_ID_1 + S\_ID_2 + \ldots S\_ID_k$ are applied to the memory array 110. In the step 266, whether the memory array 110 passes the verification is checked (that is, whether the memory array 110 is already programmed to the state 01 is checked). If yes, then the operation is ended. If no, in the step 268, the parameter "j" is added by 1 (j=j+1) and the flow returns to the step 264. That is to say, if the memory array 110 is not programmed to the state 01 yet, then the count of the applied identical pulse set verification currents is increased (for example, increased by 1).

Figure 3A:
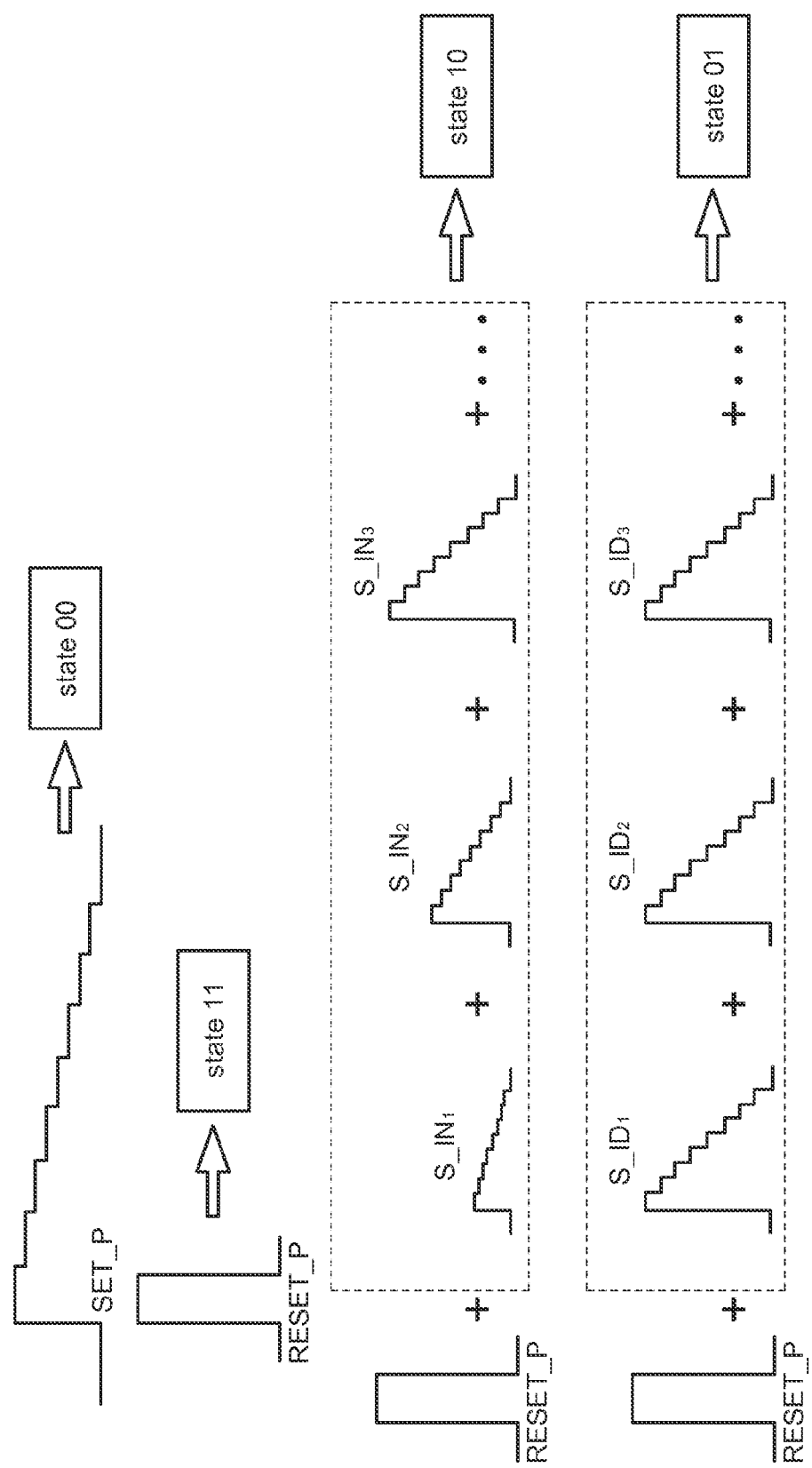
FIG. 3A shows waveforms of pulse currents applied in an embodiment of the application.

FIG. 3A shows waveforms of pulse currents applied in an embodiment of the application. As shown in FIG. 3A, in the embodiment of the application, the set pulse SET_P is in a staircase waveform having a pulse width for example 800 ns and an initial current 200 µA. The set pulse SET_P may be referred to a single staircase set pulse. That is to say, during the pulse width, the set pulse SET_P is reduced from the initial current 200 µA to a value (for example, 0 A).

The reset pulse RESET_P has a pulse width for example 40 ns and an initial current 400 µA. In the embodiment of the application, a high current (the reset pulse RESET_P) is applied in a short interval to program the memory cells in amorphous state, for programming the memory cells to the state 11.

The incremental pulse set verification currents $S\_IN_1$, $S\_IN_2, \ldots$ and $S\_IN_i$ are shown in FIG. 3A. The incremental pulse set verification currents $S\_IN_1$, $S\_IN_2, \ldots$ and $S\_IN_i$ have pulse widths of 160 ns and are in staircase waveforms. Thus, the incremental pulse set verification currents $S\_IN_1$, $S\_IN_2, \ldots$ and $S\_IN_i$ in FIG. 3A may be referred to the incremental staircase pulse set verification currents. Among the incremental pulse set verification currents $S\_IN_1$, $S\_IN_2, \ldots$ and $S\_IN_i$, the incremental pulse set verification current $S\_IN_1$ has the lowest initial current value (for example, 25 µA), the incremental pulse set verification current $S\_IN_2$ has the second lowest initial current value (for example, 25 µA+2 µA=27 µA) and so on. That is, in the embodiment, "incremental" refers to that the later-applied incremental pulse set verification current has higher initial current. As shown in the drawing, the later-applied incremental pulse set verification current $S\_IN_i$ has higher initial current than the former-applied incremental pulse set verification current $S\_IN_{(i+1)}$. In here, the allowable maximum initial current of the incremental pulse set verification currents cannot be higher than the melting current (which is for example 45 µA).

Similarly, the incremental pulse set verification current $S\_IN_i$, during the pulse width, the current value is reduced from the initial current to a value (for example, 0 µA).

The identical pulse set verification currents $S\_ID_1$, $S\_ID_2, \ldots$ and $S\_ID_j$ are shown in FIG. 3A. The identical pulse set verification currents $S\_ID_1$, $S\_ID_2, \ldots$ and $S\_ID_j$ have pulse widths of 160 ns and are in staircase waveforms. Thus, the identical pulse set verification currents $S\_ID_1$, $S\_ID_2, \ldots$ and $S\_ID_j$ in FIG. 3A may be referred to the identical staircase pulse set verification currents. The identical pulse set verification currents $S\_ID_1$, $S\_ID_2, \ldots$ and $S\_ID_j$ have the same initial current value (for example, 45 µA). In here, the allowable maximum initial current of the identical pulse set verification currents cannot be higher than the melting current (which is for example 45 µA). Similarly, the identical pulse set verification current $S\_IN_i$, during the pulse width, the current value is reduced from the initial current to a value (for example, 0 µA). In fact, the identical pulse set verification currents $S\_ID_1$, $S\_ID_2, \ldots$ and $S\_ID_j$ are the same.

Now refer to FIG. 2 and FIG. 3A. For programming the memory array 110 to the state 10, the reset pulse RESET_P is applied to the memory array 110. Then, in the first loop, the incremental pulse set verification current $S\_IN_1$ is applied to the memory array 110 and whether the memory array 110 passes the verification is determined. If not, which means the resistance of the memory array 110 is still too high, more incremental pulse set verification currents are to be applied to the memory array 110. Thus, in the second loop, the incremental pulse set verification current $S\_IN_1$ and $S\_IN_2$ are applied to the memory array 110 (that is, one more incremental pulse set verification current is applied) and whether the memory array 110 passes the verification is determined. The loop is repeated until the memory array 110 passes the verification.

Similarly, for programming the memory array 110 to the state 01, the reset pulse RESET_P is applied to the memory array 110. Then, in the first loop, the identical pulse set verification current $S\_ID_1$ is applied to the memory array 110 and whether the memory array 110 passes the verification is determined. If not, which means the resistance of the memory array 110 is still too high, more identical pulse set verification currents are to be applied to the memory array 110. Thus, in the second loop, the identical pulse set verification currents $S\_ID_1$ and $S\_ID_2$ are applied to the memory array 110 (that is, one more identical pulse set verification current is applied) and whether the memory array 110 passes the verification is determined. The loop is repeated until the memory array 110 passes the verification.

Figure 3B:
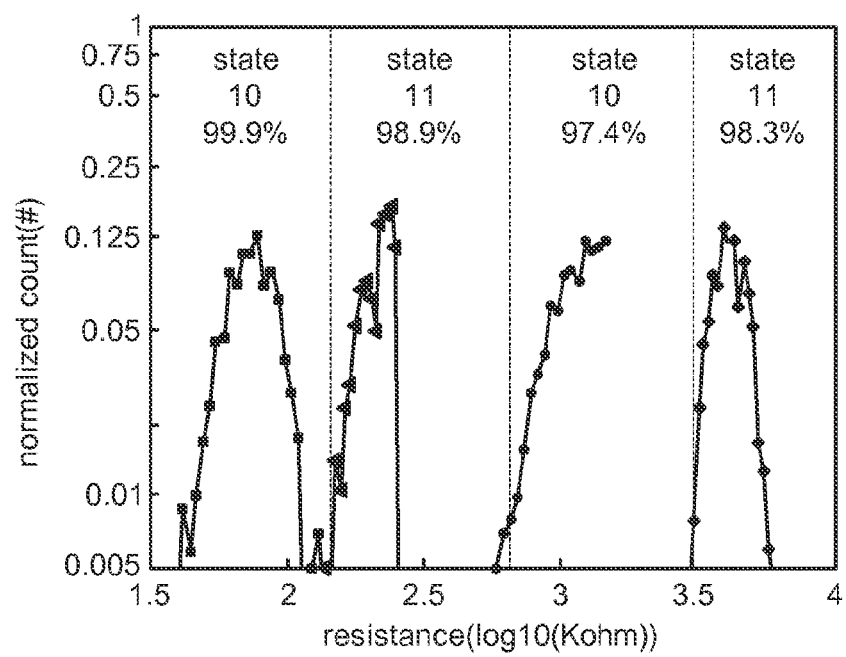
FIG. 3B shows a relationship between the resistance of the memory array and the normalized memory cell counts after the operation method of the embodiment of the application is applied.

FIG. 3B shows a relationship between the resistance of the memory array and the normalized memory cell counts after the operation method of the embodiment of the application is applied. The normalized memory cell counts refer to that the normalized percentage of the memory cells in the resistance range. As shown in FIG. 3B, after the embodiment of the application is applied, the percentage of the memory cells in the state 11 is 98.3%, the percentage of the memory cells in the state 10 is 97.4%, the percentage of the memory cells in the state 01 is 98.9%, and the percentage of the memory cells in the state 00 is 99.9%. As shown in FIG. 3B, after the embodiment of the application is applied, a large number of the memory cells are effectively programmed to the desired state, and thus the performance of the memory device is improved.

Figure 3C:
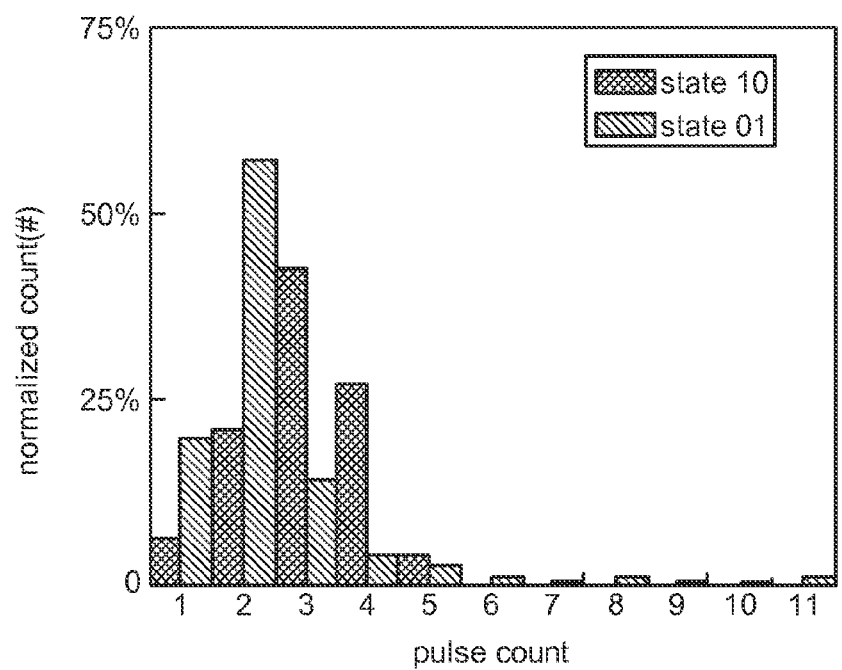
FIG. 3C shows a relationship between the pulse counts and the normalized memory cell counts after the operation method of the embodiment of the application is applied.

FIG. 3C shows a relationship between the pulse counts (the parameters "i" and/or "j") and the normalized memory cell counts after the operation method of the embodiment of the application is applied. As shown in FIG. 3C, in the state 01, a large number of the memory cells are programmed to the state 01 under the pulse number is 3 (j=3); similarly, in the state 10, a large number of the memory cells are programmed to the state 01 under the pulse number is 4 (i=4). Thus, as shown in FIG. 3C, the embodiment of the application may effectively reduce the number of the applied pulses and accordingly, the power consumption and the write latency are reduced.

Figure 4:
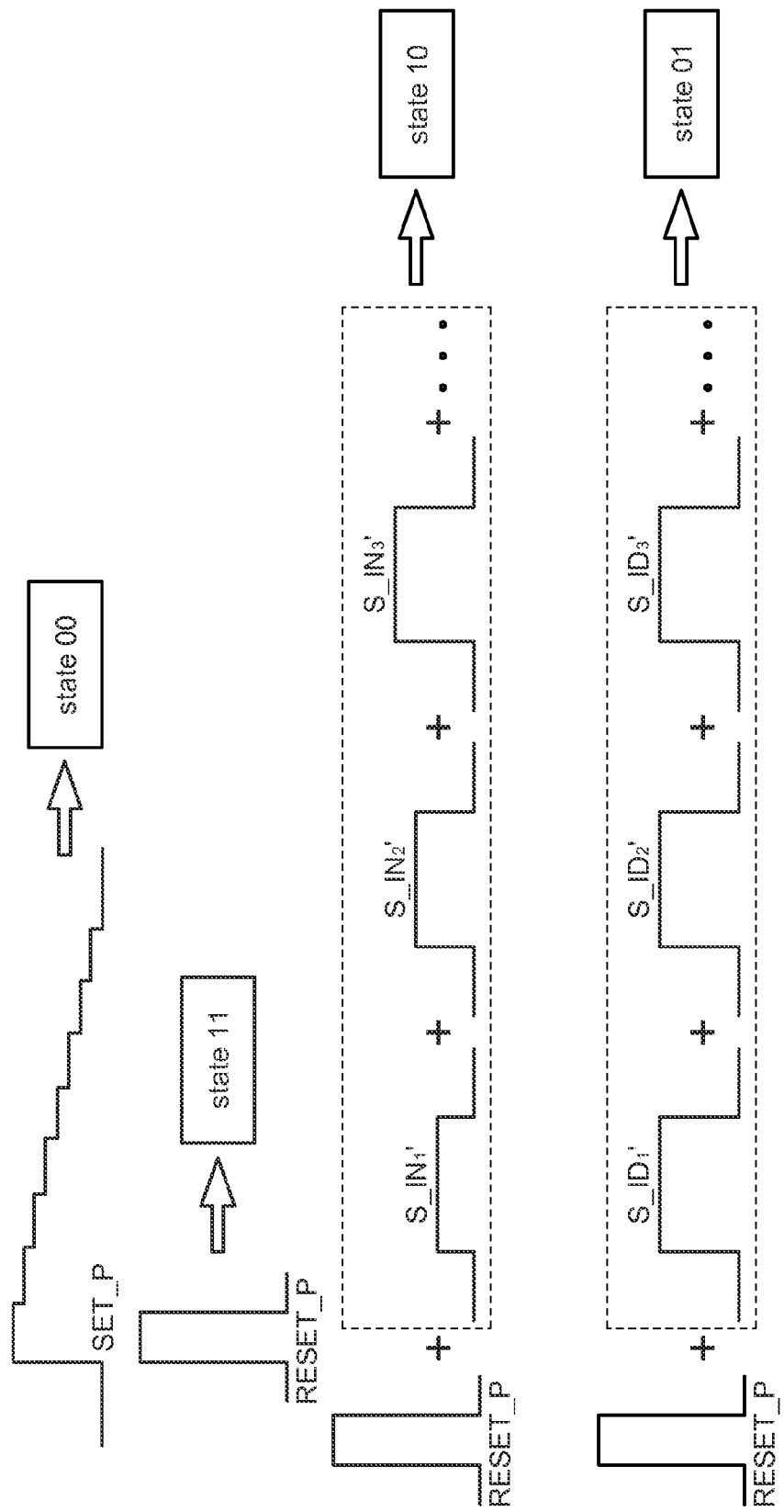
FIG. 4 shows other possible waveforms of the pulse currents applied in an embodiment of the application.

FIG. 4 shows other possible waveforms of the pulse currents applied in an embodiment of the application. The set pulse SET_P and the reset pulse RESET_P in FIG. 4 are the same or similar to the set pulse SET_P and the reset pulse RESET_P in FIG. 3 and thus the details are omitted.

In FIG. 4, the incremental pulse set verification currents $S\_IN_1'$, $S\_IN_2'$, ... and $S\_IN_i'$ have pulse widths of 40 ns and are in box waveforms. Thus, the incremental pulse set verification currents $S\_IN_1'$, $S\_IN_2'$, ... and $S\_IN_i'$ in FIG. 4 may be referred to the incremental box pulse set verification currents. Among the incremental pulse set verification currents $S\_IN_1'$, $S\_IN_2'$, ... and $S\_IN_i'$, the incremental pulse set verification current $S\_IN_1'$ has the lowest initial current value (for example, 25 μA), the incremental pulse set verification current $S\_IN_2'$ has the second lowest initial current value (for example, 25 μA+2 μA=27 μA) and so on. As shown in the drawing, the later-applied incremental pulse set verification current $S\_IN_i'$ has higher initial current than the former-applied incremental pulse set verification current $S\_IN_{(i+1)}'$. In here, the allowable maximum initial current of the incremental pulse set verification currents cannot be higher than the melting current (which is for example 45 μA).

The identical pulse set verification currents $S\_ID_1'$, $S\_ID_2'$, ... and $S\_ID_j'$ are shown in FIG. 4. The identical pulse set verification currents $S\_ID_1'$, $S\_ID_2'$, ... and $S\_ID_j'$ have pulse widths of 40 ns and are in box waveforms. Thus, the identical pulse set verification currents $S\_ID_1'$, $S\_ID_2'$, ... and $S\_ID_j'$ in FIG. 4 may be referred to the identical box pulse set verification currents. The identical pulse set verification currents $S\_ID_1'$, $S\_ID_2'$, ... and $S\_ID_j'$ have the same initial current value (for example, 45 μA). In here, the allowable maximum initial current of the identical pulse set verification currents cannot be higher than the melting current (which is for example 45 μA). In fact, the identical pulse set verification currents $S\_ID_1'$, $S\_ID_2'$, ... and $S\_ID_j'$ are the same.

Further, in the above example, although the set verification currents S_ID/S_ID'/S_IN/S_IN' are for example in staircase or box waveforms, the application is not limited by this. For example, in other possible embodiment of the application, the set verification currents S_ID/S_ID'/S_IN/S_IN' may be in triangular waveforms, or trapezium waveforms. The later-applied incremental pulse set verification currents S_IN/S_IN' have higher initial currents. The identical pulse set verification currents S_ID/S_ID' are the same.

Figure 5:
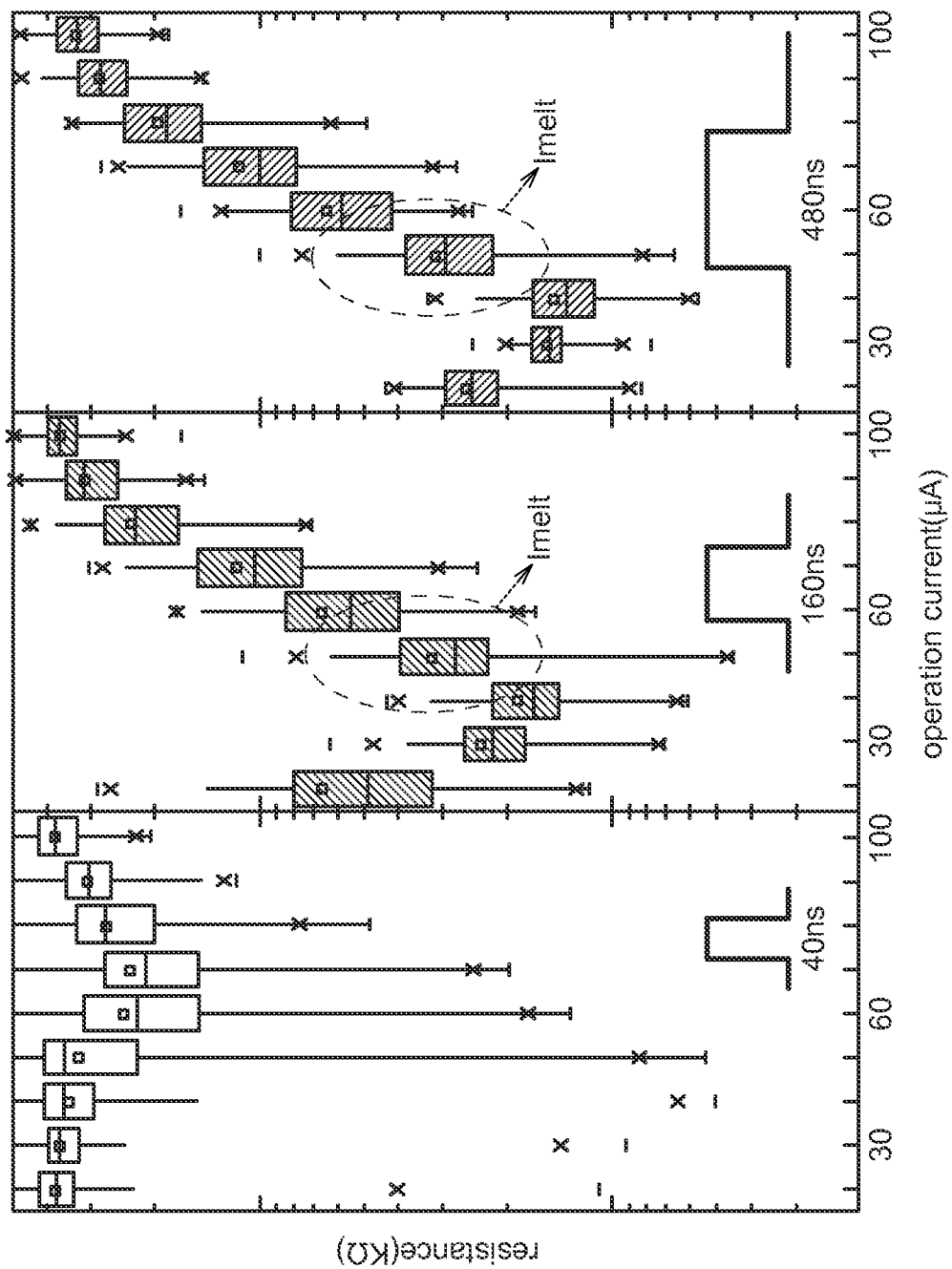
FIG. 5 shows a relationship between the resistance and the current, for showing the definition of the melting current.

FIG. 5 shows a relationship between the resistance and the current, for showing the definition of the melting current. The left drawing in FIG. 5 shows that when the pulse having 40 ns pulse width is applied, the relationship between the resistance and the current (from 10 μA to 100 μA) is shown. The middle drawing in FIG. 5 shows that when the pulse having 160 ns pulse width is applied, the relationship between the resistance and the current (from 10 μA to 100 μA) is shown. The right drawing in FIG. 5 shows that when the pulse having 480 ns pulse width is applied, the relationship between the resistance and the current (from 10 μA to 100 μA) is shown. As shown in the middle and the right drawings in FIG. 5, if the operation current is above a threshold value (about 50 μA), the resistance value will be suddenly changed from a low value to a high value. This threshold value is called as the melting current. That is, if the operation current is above the melting current, the resistance value will be suddenly changed from a low value to a high value.

Thus, in the embodiment of the application, in order to prevent the resistance have a sudden change, in programming the memory array to the state 10/01, the applied current cannot be above the melting current.

As above described, the memory device according to the embodiment of the application has advantages, such as short write latency, low write power consumption, high performance, high reliability, and fast and correct programming.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device, including:
    determining an operation state of the memory device;
    when the memory device is determined to be operated in a first operation state, applying a reset pulse to the memory device;
    when the memory device is determined to be operated in a second operation state, applying the reset pulse and at least a first incremental pulse set verification current to the memory device, an allowable maximum current of the first incremental pulse set verification current being lower than a melt current;
    when the memory device is determined to be operated in a third operation state, applying the reset pulse and at least a first identical pulse set verification current to the memory device, an allowable maximum current of the first identical pulse set verification current being lower than the melt current; and when the memory device is determined to be operated in a fourth operation state, applying a set pulse to the memory device.

2. The operation method for the memory device according to claim 1, wherein
the operation state of the memory device is determined according to an input data.

3. The operation method for the memory device according to claim 1, wherein the reset pulse includes a single staircase reset pulse for programming a plurality of memory cells of the memory device as amorphous; and
the set pulse includes a single staircase set pulse.

4. The operation method for the memory device according to claim 1, wherein
a plurality of memory cells in the first operation state have a highest resistance;
the memory cells in the second operation state have a second highest resistance;
the memory cells in the third operation state have a third highest resistance; and
the memory cells in the fourth operation state have a lowest resistance.

5. The operation method for the memory device according to claim 1, wherein
when the memory device is determined to be operated in the second operation state, after applying the reset pulse and the first incremental pulse set verification current to the memory device, checking whether the memory device is already programmed in the second operation state;
if not, applying a second incremental pulse set verification current to the memory device and checking whether the memory device is already programmed in the second operation state;
an allowable maximum current of the second incremental pulse set verification current is lower than the melt current; and
the allowable maximum current of the second incremental pulse set verification current is higher than the allowable maximum current of the first incremental pulse set verification current.

6. The operation method for the memory device according to claim 5, wherein
the first and the second incremental pulse set verification currents are chosen from a group of a staircase pulse, a rectangular pulse, a triangular pulse, and a trapezium pulse.

7. The operation method for the memory device according to claim 1, wherein
when the memory device is determined to be operated in the third operation state, after applying the reset pulse and the first identical pulse set verification current to the memory device, checking whether the memory device is already programmed in the third operation state;
if not, applying a second identical pulse set verification current to the memory device and checking whether the memory device is already programmed in the third operation state;
an allowable maximum current of the second identical pulse set verification current is lower than the melt current; and
the allowable maximum current of the second identical pulse set verification current is higher than the allowable maximum current of the first identical pulse set verification current.

8. The operation method for the memory device according to claim 7, wherein
the first and the second identical pulse set verification currents are chosen from a group of a staircase pulse, a rectangular pulse, a triangular pulse, and a trapezium pulse.

9. A memory device, including:
a memory array;
a control circuit, determining an operation state of the memory array according to an input data; and
a pulse generation circuit, coupled to the memory array and the control circuit, and controlled by the control circuit, wherein
when the control circuit determines the memory array to be operated in a first operation state, the pulse generation circuit applies a reset pulse to the memory array;
when the control circuit determines the memory array to be operated in a second operation state, the pulse generation circuit applies the reset pulse and at least a first incremental pulse set verification current to the memory array, an allowable maximum current of the first incremental pulse set verification current being lower than a melt current;
when the control circuit determines the memory array to be operated in a third operation state, the pulse generation circuit applies the reset pulse and at least a first identical pulse set verification current to the memory array, an allowable maximum current of the first identical pulse set verification current being lower than the melt current; and
when the control circuit determines the memory array to be operated in a fourth operation state, the pulse generation circuit applies a set pulse to the memory device.

10. The memory device according to claim 9, wherein
the reset pulse includes a single staircase reset pulse for programming a plurality of memory cells of the memory array as amorphous; and
the set pulse includes a single staircase set pulse.

11. The memory device according to claim 9, wherein
a plurality of memory cells in the first operation state have a highest resistance;
the memory cells in the second operation state have a second highest resistance;
the memory cells in the third operation state have a third highest resistance; and
the memory cells in the fourth operation state have a lowest resistance.

12. The memory device according to claim 9, wherein
when the control circuit determines the memory array to be operated in the second operation state, after the pulse generation circuit applies the reset pulse and the first incremental pulse set verification current to the memory array, checking whether the memory array is already programmed in the second operation state;
if not, after the pulse generation circuit applies a second incremental pulse set verification current to the memory array, the control circuit checks whether the memory array is already programmed in the second operation state;
an allowable maximum current of the second incremental pulse set verification current is lower than the melt current; and
the allowable maximum current of the second incremental pulse set verification current is higher than the allowable maximum current of the first incremental pulse set verification current.

13. The memory device according to claim 12, wherein
the first and the second incremental pulse set verification currents are chosen from a group of a staircase pulse, a rectangular pulse, a triangular pulse, and a trapezium pulse.

14. The memory device according to claim 9, wherein
when the control circuit determines the memory array to be operated in the third operation state, after the pulse generation circuit applies the reset pulse and the first identical pulse set verification current to the memory array, checking whether the memory array is already programmed in the third operation state;

if not, the pulse generation circuit applies a second identical pulse set verification current to the memory device and the control circuit checks whether the memory array is already programmed in the third operation state;

an allowable maximum current of the second identical pulse set verification current is lower than the melt current; and the allowable maximum current of the second identical pulse set verification current is higher than the allowable maximum current of the first identical pulse set verification current.

15. The memory device according to claim 14, wherein
the first and the second identical pulse set verification currents are chosen from a group of a staircase pulse, a rectangular pulse, a triangular pulse, and a trapezium pulse.

* * * * *